United States Patent
Choi et al.

(10) Patent No.: US 7,852,666 B2
(45) Date of Patent: Dec. 14, 2010

(54) NONVOLATILE MEMORY USING RESISTANCE MATERIAL

(75) Inventors: Joon-Yong Choi, Seoul (KR); Byung-Gil Choi, Yongin-si (KR)

(73) Assignee: Samsung Electronics Co. Ltd., Suwon-Si (KR)

( * ) Notice: Subject to any disclaimer, the term of this patent is extended or adjusted under 35 U.S.C. 154(b) by 86 days.

(21) Appl. No.: 12/243,578

(22) Filed: Oct. 1, 2008

(65) Prior Publication Data

US 2009/0122600 A1 May 14, 2009

(30) Foreign Application Priority Data

Oct. 11, 2007 (KR) ...................... 10-2007-0102658

(51) Int. Cl.
*G11C 11/00* (2006.01)
*G11C 8/00* (2006.01)

(52) U.S. Cl. .................................. 365/163; 365/230.03

(58) Field of Classification Search .................. 365/163
See application file for complete search history.

(56) References Cited

U.S. PATENT DOCUMENTS

| 6,741,487 B2 * | 5/2004 | Yokozeki ...................... 365/63 |
| 6,870,788 B2 * | 3/2005 | Shimizu et al. ........ 365/230.03 |
| 6,917,532 B2 | 7/2005 | Van Brocklin et al. |
| 7,227,776 B2 * | 6/2007 | Cho et al. .................... 365/163 |
| 7,397,681 B2 * | 7/2008 | Cho et al. ...................... 365/46 |
| 7,453,722 B2 * | 11/2008 | Choi et al. ................... 365/163 |
| 7,639,558 B2 * | 12/2009 | Cho et al. ............. 365/230.06 |
| 2008/0137459 A1 * | 6/2008 | Morishima .................. 365/208 |
| 2009/0097306 A1 * | 4/2009 | Park et al. .................... 365/163 |

FOREIGN PATENT DOCUMENTS

| KR | 100604935 | 7/2006 |
| KR | 1020060102682 | 9/2006 |

\* cited by examiner

*Primary Examiner*—Son L Mai
(74) *Attorney, Agent, or Firm*—F. Chau & Associates, LLC

(57) ABSTRACT

A nonvolatile memory using a resistance material includes first and second memory-cell blocks having different block address information and each including a plurality of nonvolatile memory cells; a global bitline common to the first and second memory-cell blocks; first and second local bitlines corresponding to the first and second memory-cell blocks, respectively, and coupled to each other; and a common bitline selection circuit interposed between the first and second memory-cell blocks and coupled between the first and second local bitlines and the global bitline.

20 Claims, 10 Drawing Sheets

NONVOLATILE MEMORY USING RESISTANCE MATERIAL

This application claims priority from Korean Patent Application No. 10-2007-0102658 filed on Oct. 11$^{th}$, 2008 in the Korean Intellectual Property Office, the disclosure of which is incorporated herein by reference in its entirety.

BACKGROUND

1. Technical Field

The present disclosure relates to a nonvolatile memory using a resistance material.

2. Discussion of Related Art

Nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material, such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

More specifically, a phase-change material of a PRAM becomes in a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

SUMMARY OF THE INVENTION

In order to write data to a phase-change memory cell of a PRAM, the state of a phase-change material of the phase-change memory cell must be changed. Therefore, a sufficiently large write current must be supplied to the phase-change memory cell. On the other hand, the state of the phase-change material must remain unchanged in order to read data from the phase-change memory cell. Therefore, a relatively small read current (or sensing current) must be supplied to the phase-change memory cell.

In addition, it is necessary to reduce the core layout area of the PRAM in order to increase the integration density of the PRAM.

Exemplary embodiments of the present invention provide a nonvolatile memory that can enhance reliability of its write operation by supplying a sufficiently large write current during the write operation and that can reduce its core layout area.

Exemplary embodiments of the present invention, however, are not restricted to the one set forth herein. The above and other exemplary embodiments of the present invention will become more apparent to one of ordinary skill in the art to which the present invention pertains by referencing the detailed description of the present invention given below.

According to an exemplary embodiment of the present invention, there is provided a nonvolatile memory including first and second memory-cell blocks having different block address information and each including a plurality of nonvolatile memory cells; a global bitline common to the first and second memory-cell blocks; first and second local bitlines corresponding to the first and second memory-cell blocks, respectively, and coupled to each other; and a common bitline selection circuit interposed between the first and second memory-cell blocks and coupled between the first and second local bitlines and the global bitline.

According to an exemplary embodiment of the present invention, there is provided a nonvolatile memory including first through n-th memory-cell blocks, where n is a natural number equal to or greater than two, sequentially arranged, having different block address information, and each including a plurality of nonvolatile memory cells; first through (n−1)-th common bitline selection blocks sequentially and respectively arranged between the first through n-th memory-cell blocks; a first bitline selection block disposed opposite the first common bitline selection block with respect to the first memory-cell block; and a second bitline selection block disposed opposite the (n−1)-th common bitline selection block with respect to the n-th memory-cell block.

In an exemplary embodiment of the present invention, there is provided a nonvolatile memory including first and second memory-cell blocks having different block address information and each including a plurality of nonvolatile memory cells; a global bitline common to the first and second memory-cell blocks; first and second local bitlines corresponding to the first and second memory-cell blocks, respectively, and coupled to each other; and a write circuit coupled to the global bitline and supplying write current to a nonvolatile memory cell, which is selected from the first memory-cell block, during a write period, wherein the write current has a plurality of current paths leading from the write circuit to the selected nonvolatile memory cell during the write period, and the current paths include a current path formed by the write circuit, the global bitline, the second local bitline, the first local bitline, and the selected nonvolatile memory cell arranged sequentially.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

The present invention will now be described more fully with reference to the accompanying drawings, in which exemplary embodiments of the invention are shown. The present invention may, however, be embodied in many different forms and should not be construed as being limited to the exemplary embodiments set forth herein; rather, these exemplary embodiments are provided so that this disclosure will be thorough and complete, and will fully convey the concept of the invention to those of ordinary skill in the art. Like reference numerals in the drawings denote like elements, and thus their description will be omitted.

Hereinafter, exemplary embodiments of the present invention will be described using a phase-change random access memory (PRAM). It will be seen by those of ordinary skill in the art to which the present invention pertains, however, that the present invention can be applied to all nonvolatile memories using resistance materials, such as resistive RAMs and ferroelectric RAMs.

Figure 1:
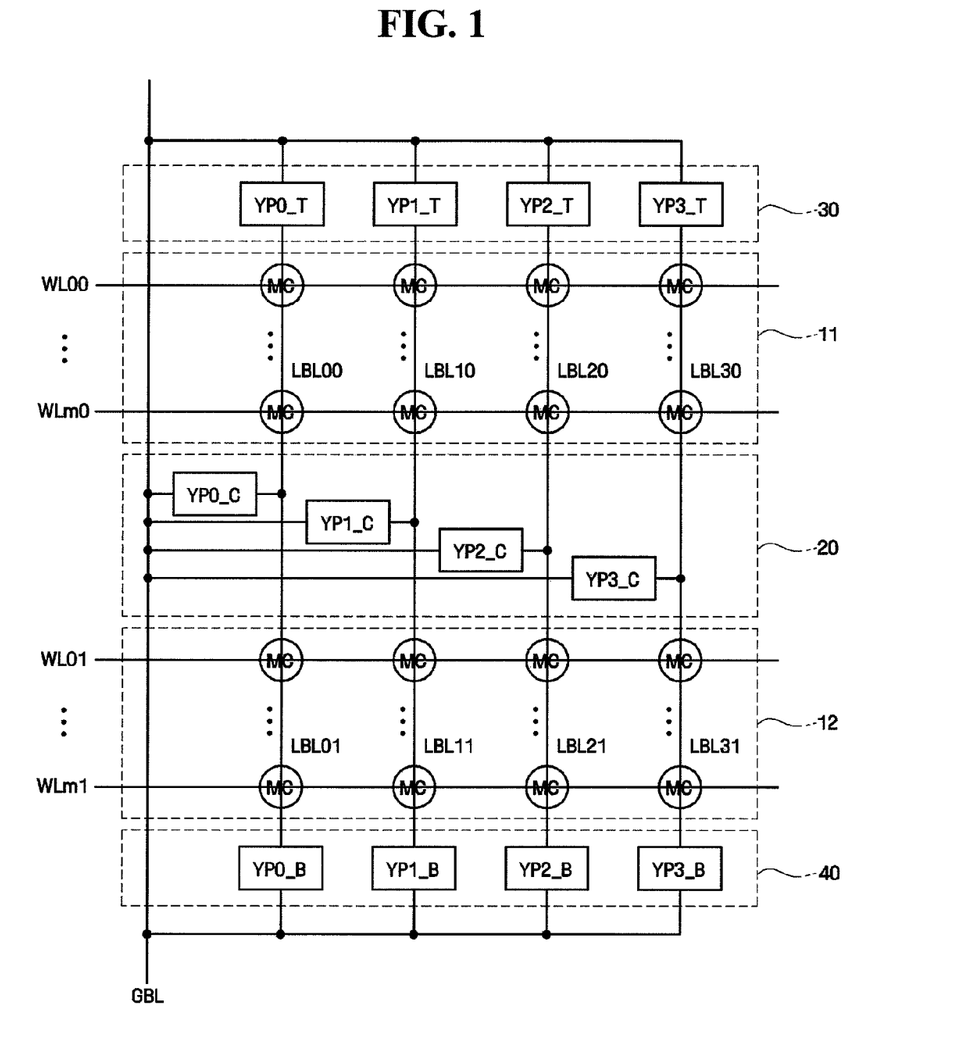
FIG. 1 is a block diagram of a nonvolatile memory according to an exemplary embodiment of the present invention.
Figure 2:
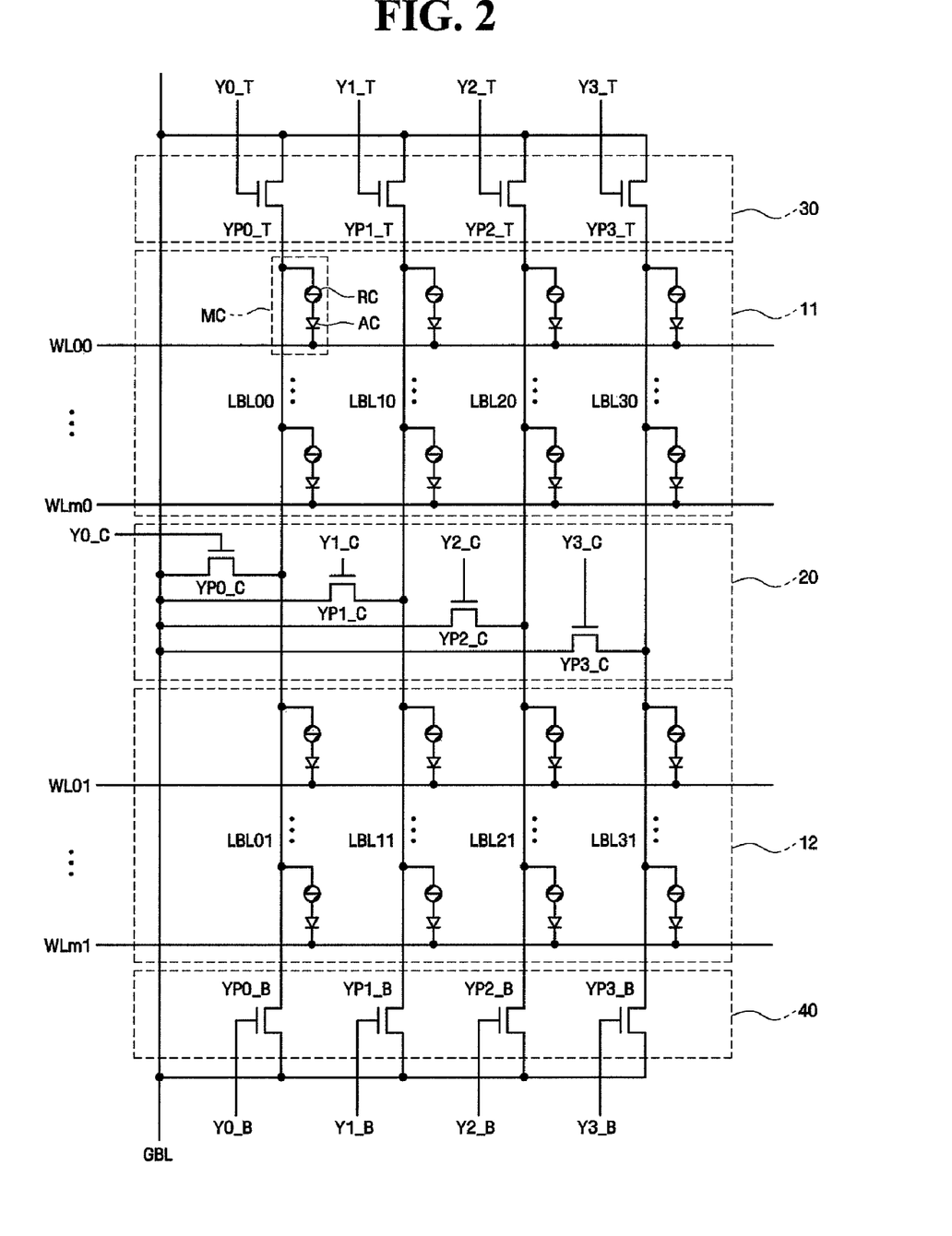
FIG. 2 is a circuit diagram of the nonvolatile memory according to an exemplary embodiment of the present invention.

FIG. 1 is a block diagram of a nonvolatile memory according to an exemplary embodiment of the present invention. FIG. 2 is a circuit diagram of the nonvolatile memory shown in FIG. 1.

Referring to FIGS. 1 and 2, the nonvolatile memory according to an exemplary embodiment of the present invention includes first and second memory-cell blocks 11 and 12, a plurality of wordlines WL00 through WLm0 and WL01 through WLm1, a plurality of local bitlines LBL00 through LBL30 and LBL01 through LBL31, a global bitline GBL, a common bitline selection block 20, a first bitline selection block 30, and a second bitline selection block 40.

Each of the first and second memory-cell blocks 11 and 12 includes rows and columns of nonvolatile memory cells MC. The rows of the nonvolatile memory cells MC are coupled to the wordlines WL00 through WLm0 and WL01 through WLm1, respectively, and the columns of the nonvolatile memory cells MC are coupled to the local bitlines LBL00 through LBL30 and LBL01 through LBL31, respectively.

In an exemplary embodiment of the present invention, the local bitlines LBL00 through LBL30 are coupled to the local bitlines LBL01 through LBL31, respectively.

In addition, as shown in FIG. 2, each of the nonvolatile memory cells MC may include a variable resistance device RC and an access device AC. The variable resistance device RC includes a phase-change material having different resistance values in a crystalline state and an amorphous state. The active device AC controls current flowing through the variable resistance device RC. The active device AC may be a diode or a transistor coupled in series to the variable resistance device RC. The variable resistance device RC illustrated in FIG. 2 is a diode. The present invention, however, is not limited thereto. The phase-change material may be a combination of two elements, such as GaSb, InSb, InSe, $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. In particular, GeSbTe, which is a combination of germanium (Ge), antimony (Sb) and tellurium (Te), may be mainly used as the phase-change material.

In an exemplary embodiment of the present invention, the first and second memory-cell blocks 11 and 12 may correspond to different block address information.

The common bitline selection block 20 is interposed between the first and second memory-cell blocks 11 and 12. The common bitline selection block 20 includes a plurality of common bitline selection circuits YP0_C through YP3_C coupled between the global bitline GBL and the local bitlines LBL00 through LBL30 and LBL01 through LBL31 that are coupled to one another. As illustrated in FIG. 2, the common bitline selection circuits YP0_C through YP3_C may be implemented as, but are not limited to, n-channel metal oxide semiconductor (NMOS) transistors that are turned on in response to a plurality of common column selection signals Y0_C through Y3_C, respectively.

The first bitline selection block 30 is disposed opposite (for example, above) the common bitline selection block 20 with respect to the first memory-cell block 11.

The first bitline selection block 30 includes a plurality of first bitline selection circuits YP0_T through YP3_T coupled between the global bitline GBL and the local bitlines LBL00 through LBL30, respectively. As illustrated in FIG. 2, the first bitline selection circuits YP0_T through YP3_T may be implemented as, but are not limited to, NMOS transistors that are turned on in response to a plurality of first column selection signals Y0_T through Y3_T, respectively.

The second bitline selection block 40 is disposed opposite (for example, under) the common bitline selection block 20 with respect to the second memory-cell block 12.

In addition, the second bitline selection block 40 includes a plurality of second bitline selection circuits YP0_B through YP3_B coupled between the global bitline GBL and the local bitlines LBL01 through LBL31, respectively. As illustrated in FIG. 2, the second bitline selection circuits YP0_B through YP3_B may be implemented as, but are not limited to, NMOS transistors that are turned on in response to a plurality of second column selection signals Y0_B through Y3_B, respectively.

Figure 3:
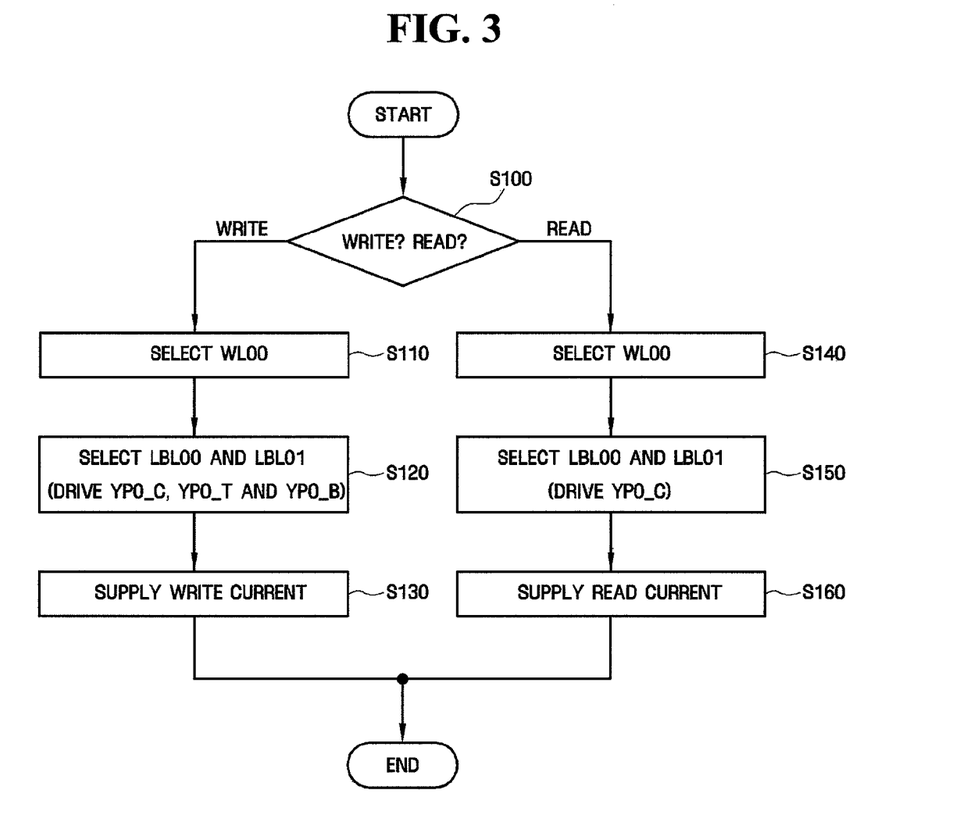
FIG. 3 is a flowchart illustrating a method of driving the nonvolatile memory according to an exemplary embodiment of the present invention.
Figure 4:
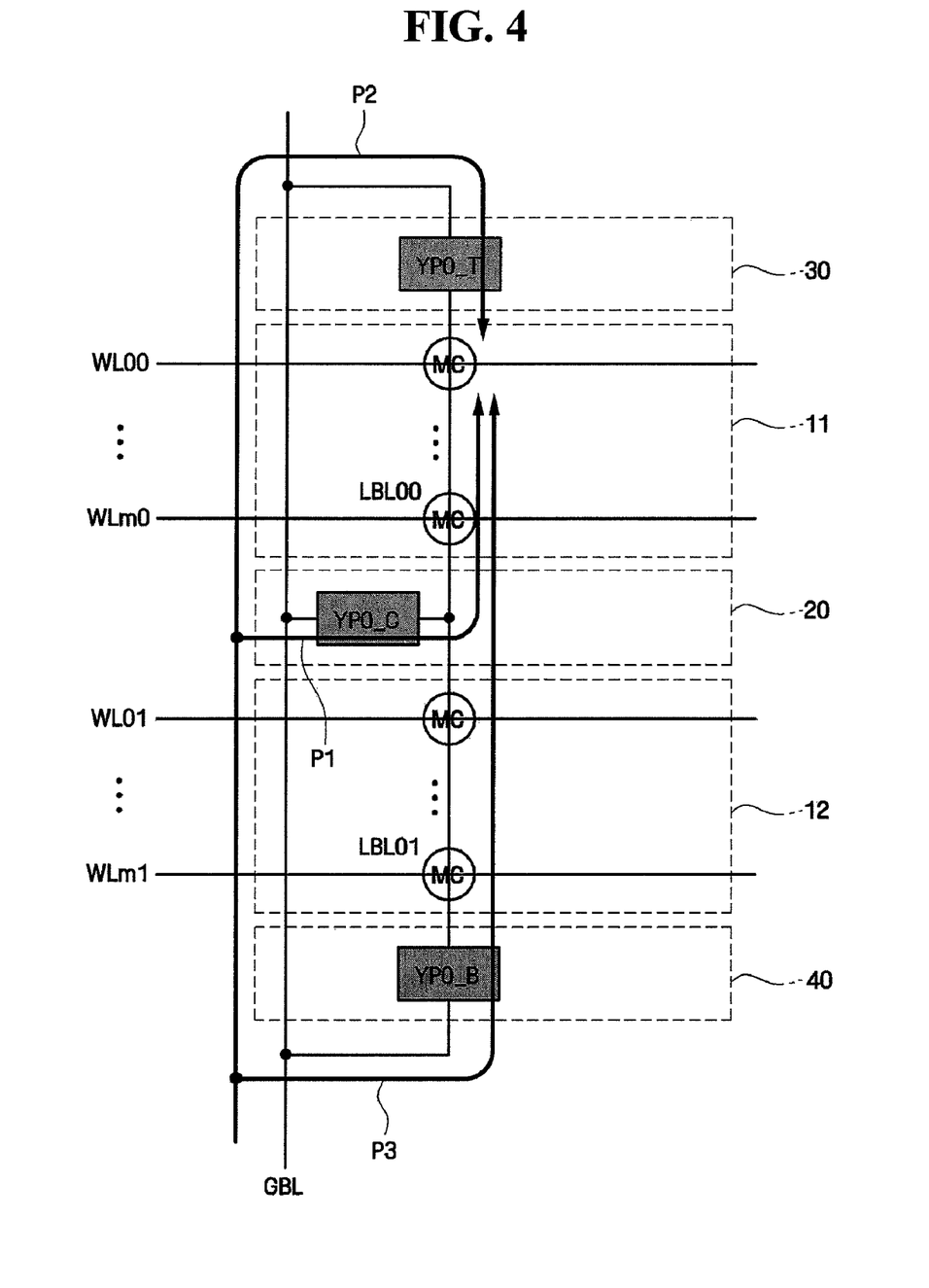
FIG. 4 is a diagram for explaining a write operation of the nonvolatile memory according to an exemplary embodiment of the present invention.
Figure 5:
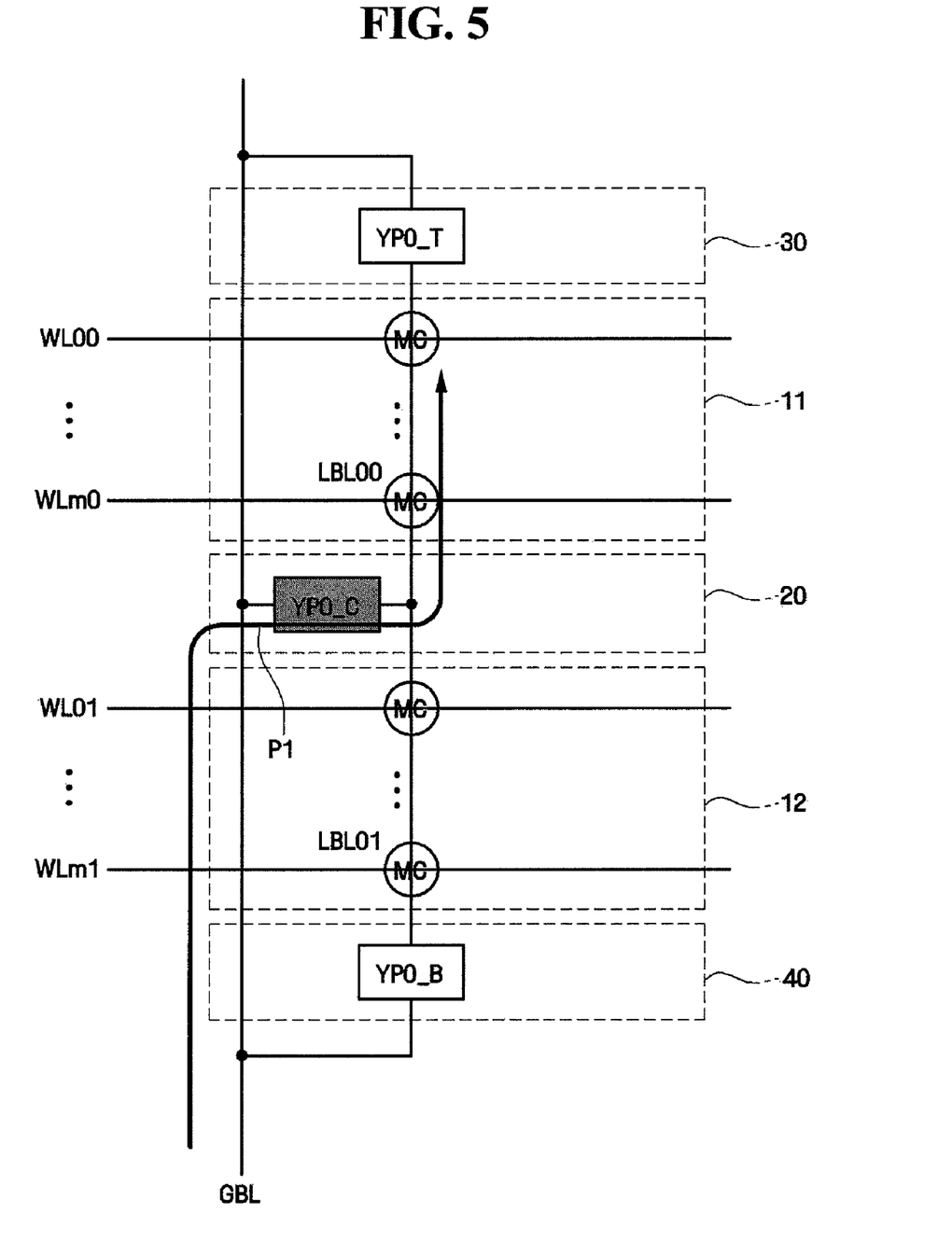
FIGS. 5 through 7 are diagrams for explaining a read operation of the nonvolatile memory according to an exemplary embodiment of the present invention.
Figure 6:
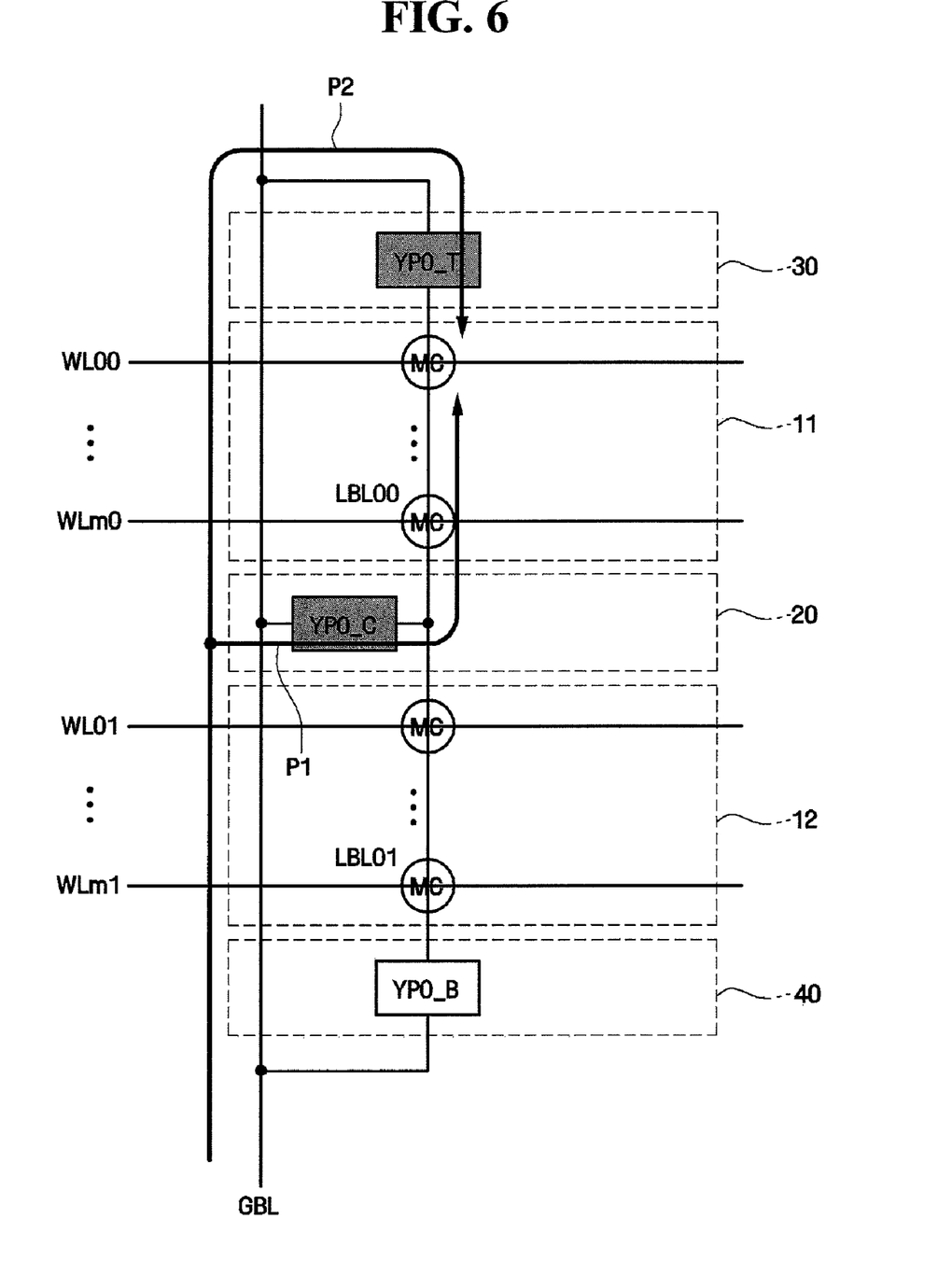
Figure 7:
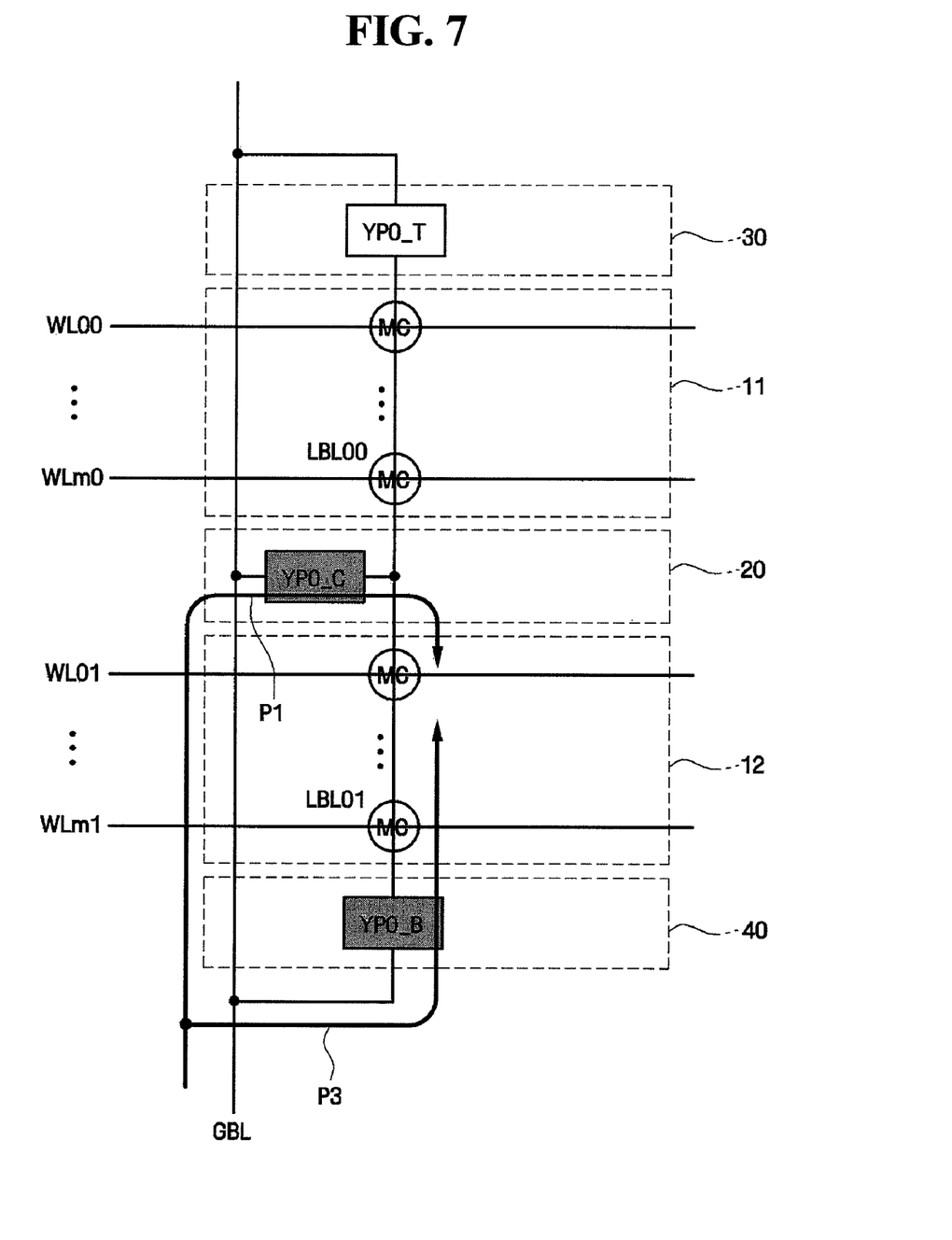

Hereinafter, the operation of the nonvolatile memory according to an exemplary embodiment of the present invention will be described with reference to FIGS. 1 and 3 through 7. FIG. 3 is a flowchart illustrating a method of driving the nonvolatile memory according to an exemplary embodiment of the present invention. FIG. 4 is a diagram for explaining a write operation of the nonvolatile memory according to an exemplary embodiment of the present invention. FIGS. 5 through 7 are diagrams for explaining a read operation of the nonvolatile memory according to an exemplary embodiment of the present invention. For the simplicity of description, FIGS. 4 through 7 illustrate the portion of the nonvolatile memory related to the local bitlines LBL00 and LBL01 in the block diagram of FIG. 1.

Referring to FIGS. 1 and 3, a method of driving the common bitline selection circuits YP0_C through YP3_C and the first and second bitline selection circuits YP0_T through YP3_T and YP0_B through YP3_B in the nonvolatile memory according to an exemplary embodiment of the present invention varies according to an operation mode of the nonvolatile memory. For example, the method of driving the common bitline selection circuits YP0_C through YP3_C and the first and second bitline selection circuits YP0_T through YP3_T and YP0_B through YP3_B during the write operation of the nonvolatile memory may be different from the method of driving the same during the read operation of the nonvolatile memory.

In FIG. 3, writing or reading data to/from the nonvolatile memory cells MC in the first memory-cell block 11 will be described. Specifically, a case where data is written to a nonvolatile memory cell MC coupled to the wordline WL00 and the local bitline LBL00 and a case where data is read from the nonvolatile memory cell MC coupled to the wordline WL00 and the local bitline LBL00 will be described as an example.

First of all, it is determined whether the operation mode of the nonvolatile memory is the read operation or the write operation (operation S100).

If the operation mode of the nonvolatile memory is the write operation, the wordline WL00 is selected (operation S110).

The common bitline selection circuit YP0_C, which is coupled to the local bitlines LBL00 and LBL01, and the first and second bitline selection circuits YP0_T and YP0_B are driven to electrically connect the local bitlines LBL00 and LBL01 to the global bitline GBL (operation S120).

Then, write current is supplied to the nonvolatile memory cell MC, which is coupled to the wordline WL00 and the local bitline LBL00, and thus data is written to the nonvolatile memory cell MC (operation S130).

Specifically, the write current may have three current paths, that is, first through third current paths P1 through P3, as illustrated in FIG. 4. The first current path P1 may be formed by a write circuit (not shown), the global bitline GBL, the common bitline selection circuit YP0_C, the local bitline LBL00, and the wordline WL00 arranged sequentially. The second current path P2 may be formed by the write circuit (not shown), the global bitline GBL, the first bitline selection circuit YP0_T, the local bitline LBL00, and the wordline WL00 arranged sequentially. In addition, the third current path P3 may be formed by the write circuit (not shown), the global bitline GBL, the second bitline selection circuit YP0_B, the local bitline LBL01, the local bitline LBL00, and the wordline WL00 arranged sequentially.

More specifically, the third current path P3 passing through the local bitline LBL01 in the second memory-cell block 12 may be formed in an exemplary embodiment of the present invention. In an exemplary embodiment of the present invention, because the number of current paths leading to the nonvolatile memory cell MC is increased, a sufficient write current can be supplied to the nonvolatile memory cell MC.

On the other hand, if the operation mode of the nonvolatile memory is the read operation, the wordline WL00 is selected (operation S140), as shown in FIG. 3.

The common bitline selection circuit YP0_C coupled to the local bitlines LBL00 and LBL01 is driven to electrically connect the local bitlines LBL00 and LBL01 to the global bitline GBL (operation S150).

Then, read current is supplied to the nonvolatile memory cell MC, which is coupled to the wordline WL00 and the local bitline LBL00, and thus data is read from the nonvolatile memory cell MC (operation S160).

Specifically, the read current may have one current path as illustrated in FIG. 5. That is, the read current may have a first current path P1 formed by a read circuit (not shown), the global bitline GBL, the common bitline selection circuit YP0_C, the local bitline LBL00, and the wordline WL00 arranged sequentially. Thus, it can be understood that, when the nonvolatile memory performs the read operation, second and third current paths P2 and P3 are not formed.

Because the read current must not change the state of the phase-change material, it is relatively smaller than the write current. Even if only the common bitline selection circuit YP0_C is driven, a sufficient amount of read current required for the read operation can be supplied to the nonvolatile memory cell MC. In addition, because only the single bitline selection circuit YP0_C is driven, the amount of current consumed by an operation circuit (not shown) in order to operate the bitline selection circuit YP0_C can be reduced. Consequently, current consumption during the read operation of the nonvolatile memory can be reduced.

FIG. 5 illustrates a case where only the common bitline selection circuit YP0_C is driven during the read operation of the nonvolatile memory, however, the present invention is not limited thereto.

Specifically, when the nonvolatile memory performs the read operation, any one of the first and second bitline selection circuits YP0_T and YP0_B can be driven. For example, during the read operation of the nonvolatile memory, the first bitline selection circuit YP0_T may be driven in order to select a nonvolatile memory cell MC in the first memory-cell block 11, and the second bitline selection circuit YP0_B may be driven in order to select a nonvolatile memory cell MC in the second memory-cell block 12.

When necessary, as illustrated in FIG. 6, the common bitline selection circuit YP0_C and the first bitline selection circuit YP0_T may be driven in order to select a nonvolatile memory cell MC in the first memory-cell block 11 during the read operation of the nonvolatile memory. Alternatively, as illustrated in FIG. 7, the common bitline selection circuit YP0_C and the second bitline selection circuit YP0_B may be driven in order to select a nonvolatile memory cell MC in the second memory-cell block 12 during the read operation of the nonvolatile memory.

Although not described with reference to the attached drawings, a number a (a is a natural number) of the common bitline selection circuit YP0_C and the first and second bitline selection circuits YP0_T and YP0_B may be enabled when the nonvolatile memory performs the write operation, and a number b (b is a natural number equal to or smaller than a) of the common bitline selection circuit YP0_C and the first and second bitline selection circuits YP0_T and YP0_B may be enabled when the nonvolatile memory performs the read operation, which are within the scope of the present invention.

In an exemplary embodiment of the present invention, the method of driving the common bitline selection circuit YP0_C and the first and second bitline selection circuits YP0_T and YP0_B varies according to whether the nonvolatile memory performs the write operation or the read operation, however, the present invention is not limited thereto. That is, the method of driving the common bitline selection circuit YP0_C and the first and second bitline selection circuits YP0_T and YP0_B may vary according to a first or second period, without departing from the scope of the present invention.

When the consumption of read current need not be taken into consideration, the common bitline selection block 20 and the first and second bitline selection blocks 30 and 40 may all be enabled regardless of the operation mode of the nonvolatile memory. For example, in order to select the nonvolatile memory cell MC coupled to the wordline WL00 and the local bitline LBL00, the common bitline selection circuit YP0_C in the common bitline selection block 20 and the first and second bitline selection circuits YP0_T and YP0_B in the first and second bitline selection blocks 30 and 40 may be enabled.

As described above with reference to FIGS. 1 through 7, the nonvolatile memory according to an exemplary embodiment includes the common bitline selection block 20 and the first and second bitline selection blocks 30 and 40. Therefore, the nonvolatile memory can supply a sufficiently large write current to the nonvolatile memory cells MC while performing the write operation and minimize current consumption while performing the read operation.

In addition, all of the common bitline selection block 20 and the first and second bitline selection blocks 30 and 40 are driven in order to select the memory cells MC within the first and second memory-cell blocks 11 and 12. Therefore, the number of bitline selection blocks related to the operation of the first and second memory-cell blocks 11 and 12 is three. On the other hand, if bitline selection blocks are disposed on both sides of each of the first memory-cell block 11 and the second memory-cell block 12, the number of bitline selection blocks related to the operation of the first and second memory-cell blocks 11 and 12 may be four. Because the number of bitline selection blocks related to the operation of the first and second memory-cell blocks 11 and 12 is only three in the present invention, a core layout area can be reduced.

Figure 8:
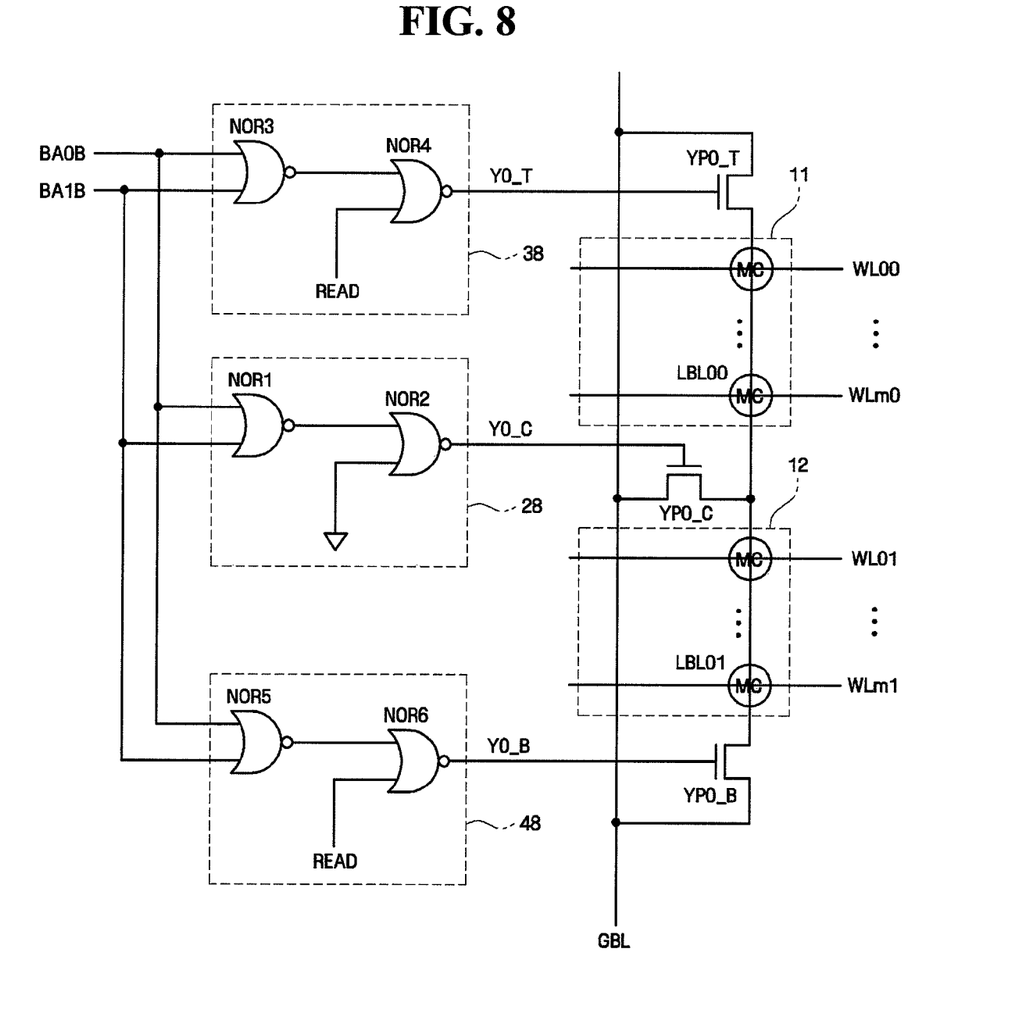
FIG. 8 is a circuit diagram of a nonvolatile memory according to an exemplary embodiment of the present invention.

FIG. 8 is a circuit diagram of a nonvolatile memory according to an exemplary embodiment of the present invention.

Referring to FIG. 8, the nonvolatile memory according to an exemplary embodiment of the present invention includes a common driving circuit 28 for enabling a common bitline selection circuit YP0_C and first and second driving circuits 38 and 48 for enabling first and second bitline selection circuits YP0_T and YP0_B, respectively.

The common driving circuit 28 and the first and second driving circuits 38 and 48 illustrated in FIG. 8 may implement the driving method described above with reference to FIGS. 4 and 5. That is, the common driving circuit 28 and the first and second driving circuits 38 and 48 are used to drive respectively the first and second bitline selection circuits YP0_T and YP0_B when the nonvolatile memory performs a write operation and to drive the common bitline selection circuit YP0_C when the nonvolatile memory performs a read operation.

Specifically, block address information BA0B and BA1B may be signals obtained after block addresses provided by an external source are decoded. A read signal READ is activated to a high level when the nonvolatile memory performs the read operation and deactivated to a low level when the nonvolatile memory performs the write operation.

The common bitline selection circuit YP0_C may include a NOR gate NOR1 receiving the block address information BA0B and BA1B and a NOR gate NOR2 receiving an output of the NOR gate NOR1 and a voltage signal VSS and outputting a common bitline selection signal Y0_C.

The first bitline selection circuit YP0_T may include a NOR gate NOR3 receiving the block address information BA0B and BA1B and a NOR gate NOR4 receiving an output of the NOR gate NOR3 and the read signal READ and outputting a first bitline selection signal Y0_T. The second bitline selection circuit YP0_B may include a NOR gate NOR5 receiving the block address information BA0B and BA1B and a NOR gate NOR6 receiving an output of the NOR gate NOR5 and the read signal READ and outputting a second bitline selection signal Y0_B.

Figure 9:
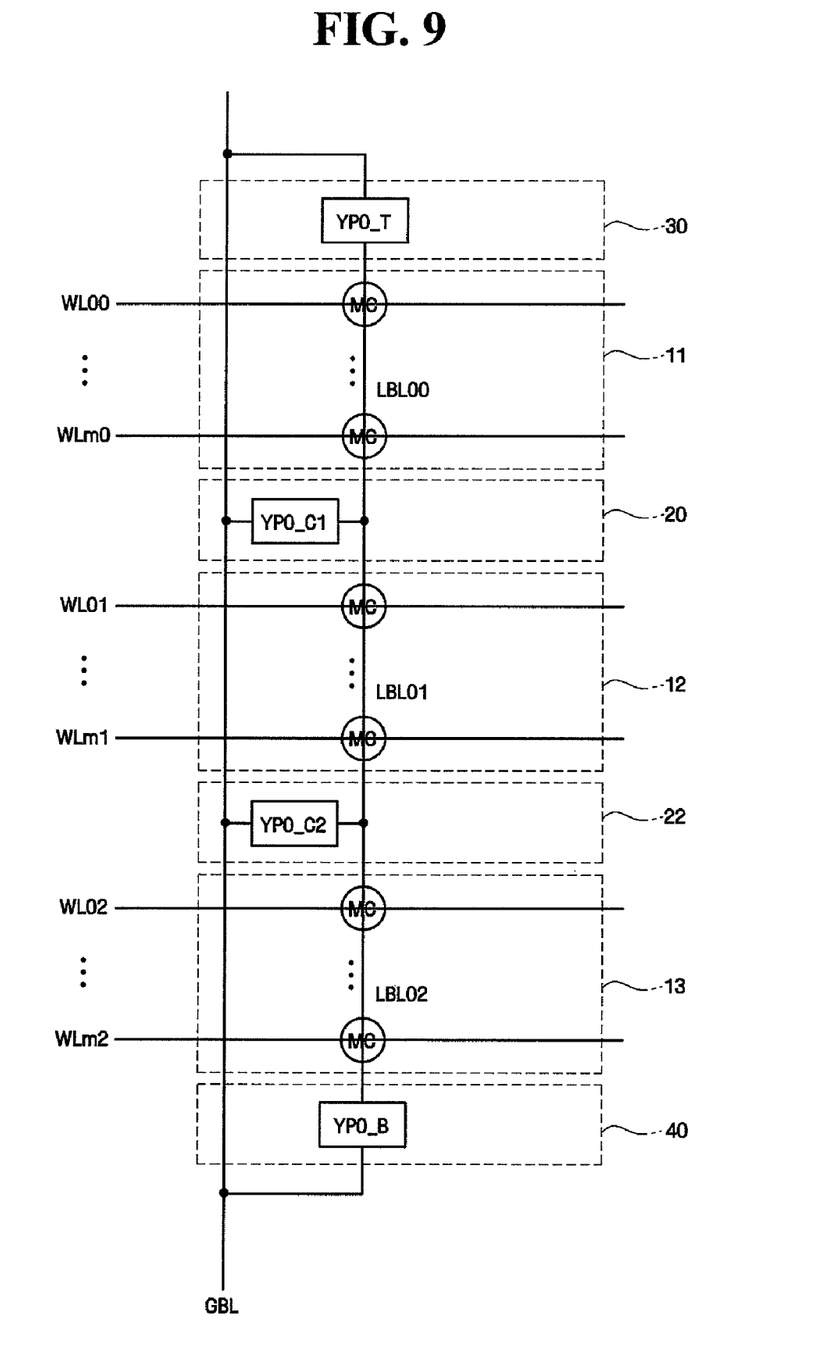
FIG. 9 is a block diagram of a nonvolatile memory according to an exemplary embodiment of the present invention.

FIG. 9 is a block diagram of a nonvolatile memory according to an exemplary embodiment of the present invention.

Referring to FIG. 9, the nonvolatile memory according to an exemplary embodiment of the present invention includes first, second, and third memory-cell blocks 11, 12, and 13, respectively, a plurality of wordlines WL00 through WLm0, WL01 through WLm1 and WL02 through WLm2, a plurality of local bitlines LBL00 through LBL02, a global bitline GBL, first and second common bitline selection blocks 20 and 22, a first bitline selection block 30, and a second bitline selection block 40.

The first, second, and third memory-cell blocks 11, 12, and 13 correspond to different respective block address information.

In addition, the first common bitline selection block 20 is interposed between the first and second memory-cell blocks 11 and 12, and the second common bitline selection block 22 is interposed between the second and third memory-cell blocks 12 and 13. The first common bitline selection block 20 may include a first common bitline selection circuit YP0_C1 coupled between the local bitlines LBL00 and LBL01, which are coupled to each other, and the global bitline GBL. The second common bitline selection block 22 may include a second common bitline selection circuit YP0_C2 coupled between the local bitlines LBL01 and LBL02, which are coupled to each other, and the global bitline GBL.

The nonvolatile memory according to an exemplary embodiment may be driven using a method similar to the driving method described above with reference to FIGS. 4 through 7. For example, the first and second common bitline selection circuits YP0_C1 and YP0_C2 and first and second bitline selection circuits YP0_T and YP0_B may all be enabled during a write operation of the nonvolatile memory, and some of the first and second common bitline selection circuits YP0_C1 and YP0_C2 and the first and second bitline selection circuits YP0_T and YP0_B may be enabled during a read operation of the nonvolatile memory. That is, only the first and second common bitline selection circuits YP0_C1 and YP0_C2 are enabled during the read operation of the nonvolatile memory.

In FIG. 9, three memory-cell blocks, that is, the first, second, and third memory-cell blocks 11, 12, and 13, respectively, are used, however, the scope of the present invention can be expanded to include a case where n (n is a natural number) memory-cell blocks having different block address information are used.

Specifically, a nonvolatile memory according to an exemplary embodiment of the present invention may include first through $n^{th}$ memory-cell blocks (n is a natural number equal to or greater than two) sequentially arranged, first through $(n-1)^{th}$ common bitline selection blocks sequentially and respectively arranged between the first through $n^{th}$ memory-cell blocks, a first bitline selection block disposed opposite the first common bitline selection block with respect to the first memory-cell block, and a second bitline selection block disposed opposite the $(n-1)^{th}$ common bitline selection block with respect to the $n^{th}$ memory-cell block.

The nonvolatile memory according to this exemplary embodiment of the present invention may include a global bitline common to the first through $n^{th}$ memory-cell blocks and first through $n^{th}$ local bitlines corresponding to the first through $n^{th}$ memory-cell blocks, respectively. The first through $n^{th}$ local bitlines may be coupled to one another.

During a first period (for example, a write period), a number a (a is a natural number) of the first through $(n-1)^{th}$ common bitline selection blocks and the first and second bitline selection blocks may be enabled. During a second period (for example, a read period), a number b (b is a natural number equal to or smaller than a) of the first through $(n-1)^{th}$ common bitline selection blocks and the first and second bitline selection blocks may be enabled. For example, all of the first through $(n-1)^{th}$ common bitline selection blocks and the first and second bitline selection blocks may be enabled during the first period, and only the first through $(n-1)^{th}$ common bitline selection blocks may be enabled during the second period.

Figure 10:
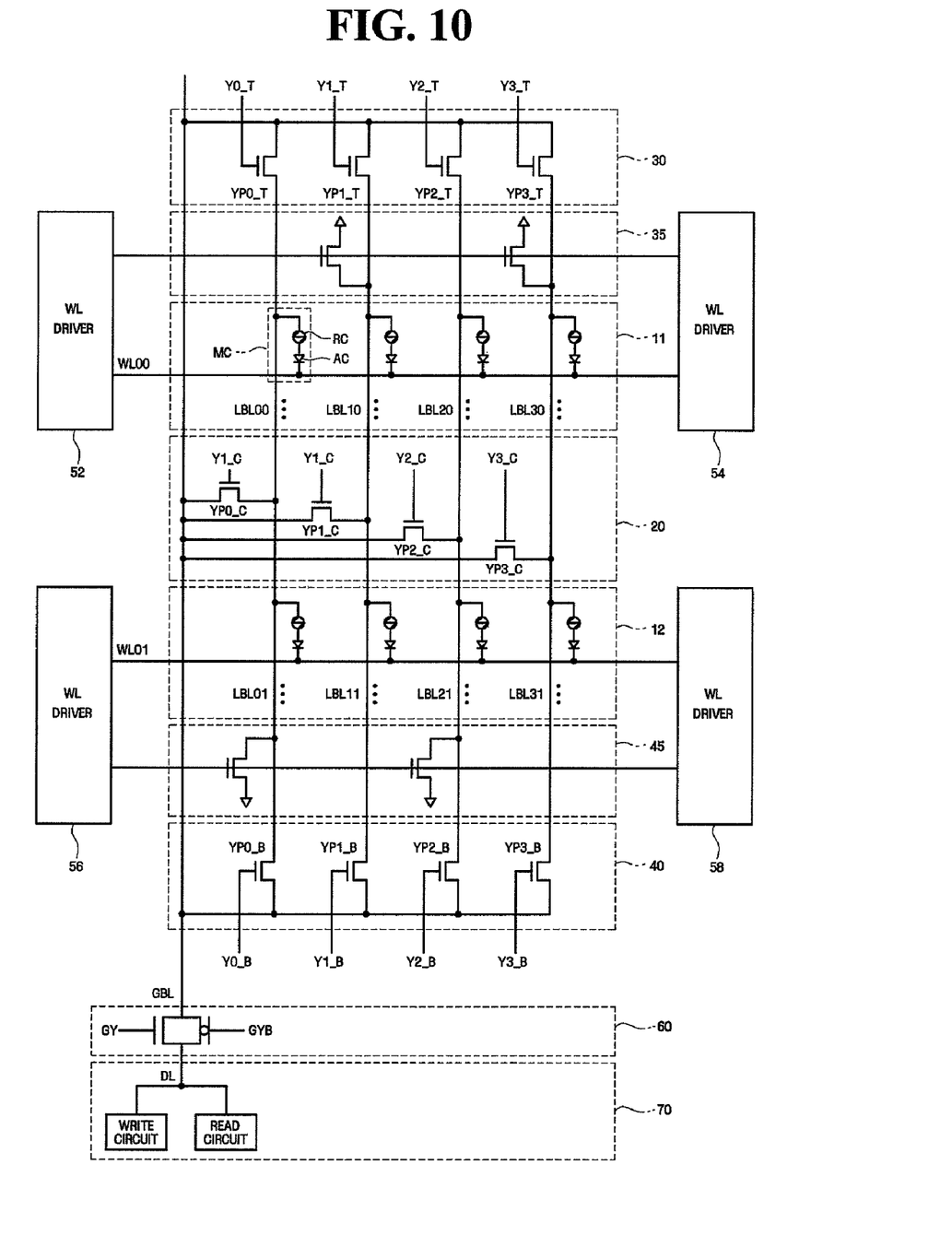
FIG. 10 is a circuit diagram of a nonvolatile memory according to an exemplary embodiment of the present invention.

FIG. 10 is a circuit diagram of a nonvolatile memory according to a fourth embodiment of the present invention.

Referring to FIG. 10, the nonvolatile memory according to an exemplary embodiment of the present invention includes first and second memory-cell blocks 11 and 12, a plurality of wordlines WL00 and WL01, a plurality of local bitlines LBL00 through LBL30 and LBL01 through LBL31, a global bitline GBL, a common bitline selection block 20, a first bitline selection block 30, a second bitline selection block 40, a first bitline discharge block 35, a second bitline discharge block 45, a plurality of wordline driver blocks 52, 54, 56, and 58, a global bitline selection block 60, and a write and read circuit block 70.

The common bitline selection block 20 is interposed between the first and second memory-cell blocks 11 and 12. The first bitline selection block 30 is disposed on a first side of (for example, above) the first memory-cell block 11, and the second bitline selection block 40 is disposed on a second side of (for example, under) the second memory-cell block 12. The wordline driver blocks 52 and 56 are disposed on a third side of (for example, on a left side of) the first and second memory-cell blocks 11 and 12, respectively, and the wordline driver blocks 54 and 58 are disposed on a fourth side of (for example, on a right side of) the first and second memory-cell blocks 11 and 12, respectively.

The first bitline discharge block 35 is interposed between the first memory-cell block 11 and the first bitline selection block 30, and the second bitline discharge block 45 is interposed between the second memory-cell block 12 and the second bitline selection block 40.

In addition, the global bitline selection block 60 and the write and read circuit block 70 are disposed on the second side of (for example, under) the second bitline selection block 40.

Referring to the first and second bitline discharge blocks 35 and 45, a discharge circuit (for example, a discharge transistor) is formed in any one of every two local bitlines (for example, the local bitlines LBL00 and LBL01). Because discharge transistors are generally small, they consume a lot of standby current due to a narrow width effect. In this exemplary embodiment of the present invention, because one discharge transistor is allocated to every two local bitlines (for example, the local bitlines LBL00 and LBL01), the standby current can be reduced. In addition, because a smaller number of discharge transistors is used when one discharge transistor is allocated to every two local bitlines than when one discharge transistor is allocated to each local bitline, the core layout area can be reduced.

It can be seen from FIG. 10 that the discharge transistors are arranged in a zigzag form, and such an arrangement of the discharge transistors is designed to enhance convenience of layout.

As described above, a nonvolatile memory according to exemplary embodiments of the present invention can enhance the efficiency of its write operation by supplying a sufficiently large write current during the write operation. In addition, the nonvolatile memory can reduce its core layout area, even though it supplies a sufficiently large write current. Because the number of transistors used in the core can be reduced, the standby current can also be reduced.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A nonvolatile memory comprising:
   first and second memory-cell blocks having different respective block address information and each comprising a plurality of nonvolatile memory cells;
   a global bitline common to the first and second memory-cell blocks;
   first and second local bitlines corresponding to the first and second memory-cell blocks, respectively, and coupled to each other;
   a common bitline selection circuit interposed between the first and second memory-cell blocks and coupled between the first and second local bitlines and the global bitline;
   a first bitline selection circuit disposed opposite the common bitline selection circuit with respect to the first memory-cell block and coupled between the first local bitline and the global bitline; and
   a second bitline selection circuit disposed opposite the common bitline selection circuit with respect to the second memory-cell block and coupled between the second local bitline and the global bitline.

2. The memory of claim 1, wherein the common bitline selection circuit and the first and second bitline selection circuits are simultaneously enabled.

3. The memory of claim 1, wherein a number a, where a is a natural number, of the common bitline selection circuit and the first and second bitline selection circuits are enabled during a first period, and a number b, where b is a natural number, of the common bitline selection circuit and the first and second bitline selection circuits are enabled during a second period, wherein b is equal to or smaller than a.

4. The memory of claim 3, wherein the first period is a write period, and the second period is a read period.

5. The memory of claim 3, wherein the common bitline selection circuit and the first and second bitline selection circuits are enabled during the first period, and the common bitline selection circuit is enabled during the second period.

6. The memory of claim 1, further comprising:
   a common driving circuit enabling the common bitline selection circuit; and
   first and second driving circuits enabling the first and second bitline selection circuits, respectively.

7. The memory of claim 1, wherein the common bitline selection circuit is enabled in response to a signal generated using first block address information and second block address information that correspond to the first and second memory-cell blocks, respectively.

8. The memory of claim 1, further comprising a discharge circuit coupled to any one of the first and second local bitlines.

9. The memory of claim 1, wherein the nonvolatile memory cells are phase-change memory cells.

10. A nonvolatile memory comprising:
    first through n-th memory-cell blocks, n is a natural number equal to or greater than two, sequentially arranged, having different respective block address information, and each comprising a plurality of nonvolatile memory cells;
    first through (n−1)-th common bitline selection blocks sequentially and respectively arranged between the first through n-th memory-cell blocks;
    a first bitline selection block disposed opposite the first common bitline selection block with respect to the first memory-cell block; and
    a second bitline selection block disposed opposite the (n−1)-th common bitline selection block with respect to the n-th memory-cell block.

11. The memory of claim 10, further comprising:
    a global bitline common to the first through n-th memory-cell blocks; and
    first through n-th local bitlines corresponding to the first through n-th memory-cell blocks, respectively,
    wherein the first through n-th local bitlines are coupled to one another.

12. The memory of claim 10, wherein the first through (n−1)-th common bitline selection blocks and the first and second bitline selection blocks are simultaneously enabled.

13. The memory of claim 10, wherein a number a, where a is a natural number, of the first through (n−1)-th common bitline selection blocks and the first and second bitline selection blocks are enabled during a first period, and a number b, where b is a natural number, of the first through (n−1)-th common bitline selection blocks and the first and second bitline selection blocks are enabled during a second period, wherein b is equal to or smaller than a.

14. The memory of claim 13, wherein the first period is a write period, and the second period is a read period.

15. The memory of claim 13, wherein the first through (n−1)-th common bitline selection blocks and the first and second bitline selection blocks are enabled during the first period, and the first through (n−1)-th common bitline selection blocks are enabled during the second period.

16. A nonvolatile memory comprising:
   first and second memory-cell blocks having different respective block address information and each comprising a plurality of nonvolatile memory cells;
   a global bitline common to the first and second memory-cell blocks;
   first and second local bitlines corresponding to the first and second memory-cell blocks, respectively, and coupled to each other; and
   a write circuit coupled to the global bitline and supplying write current to a nonvolatile memory cell, which is selected from the first memory-cell block, during a write period,
   wherein the write current has a plurality of current paths leading from the write circuit to the selected nonvolatile memory cell during the write period, and the plurality of current paths comprise a current path formed by the write circuit, the global bitline, the second local bitline, the first local bitline, and the selected nonvolatile memory cell arranged sequentially.

17. The memory of claim 16, further comprising a read circuit coupled to the global bitline and supplying read current to a nonvolatile memory cell, which is selected from the first memory-cell block, during a read period,
   wherein the read current has at least one current path leading from the read circuit to the selected nonvolatile memory cell during the read period, and the at least one current path comprises a current path not formed by the read circuit, the global bitline, the second local bitline, the first local bitline, and the selected nonvolatile memory cell arranged sequentially.

18. The memory of claim 16, wherein the plurality of current paths of the write current comprises a current path formed by the write circuit, the global bitline, the first local bitline, and the selected nonvolatile memory cell arranged sequentially.

19. The memory of claim 16, further comprising:
   a common bitline selection circuit interposed between the first and second memory-cell blocks and coupled between the first and second local bitlines and the global bitline;
   a first bitline selection circuit disposed opposite the common bitline selection circuit with respect to the first memory-cell block and coupled between the first local bitline and the global bitline; and
   a second bitline selection circuit disposed opposite the common bitline selection circuit with respect to the second memory-cell block and coupled between the second local bitline and the global bitline.

20. The memory of claim 19, wherein the common bitline selection circuit and the first and second bitline selection circuits are enabled during the write period.

* * * * *